(12) United States Patent
Kuramoto et al.

(10) Patent No.: US 10,361,062 B2
(45) Date of Patent: Jul. 23, 2019

(54) SCANNING ELECTRON MICROSCOPE

(71) Applicant: JEOL Ltd., Tokyo (JP)

(72) Inventors: Tatsuru Kuramoto, Tokyo (JP);
Yuichiro Ohori, Tokyo (JP); Yoshinori Matsuda, Tokyo (JP); Makoto Aoshima, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/902,251

(22) Filed: Feb. 22, 2018

(65) Prior Publication Data

US 2018/0240644 A1    Aug. 23, 2018

(30) Foreign Application Priority Data

Feb. 23, 2017   (JP) .................................. 2017-032554

(51) Int. Cl.
*H01J 37/28* (2006.01)
*H01J 37/244* (2006.01)
*H01J 37/10* (2006.01)
*H01J 37/147* (2006.01)

(52) U.S. Cl.
CPC ............ *H01J 37/244* (2013.01); *H01J 37/10* (2013.01); *H01J 37/147* (2013.01); *H01J 37/28* (2013.01); *H01J 2237/2443* (2013.01)

(58) Field of Classification Search
CPC ........ H01J 37/147; H01J 37/244; H01J 37/28; H01J 2237/2443
See application file for complete search history.

(56) References Cited

U.S. PATENT DOCUMENTS

| | | | |
|---|---|---|---|
| 6,211,525 B1 * | 4/2001 | Cowham | ............... H01J 37/244 250/397 |
| 6,545,277 B1 | 4/2003 | Kella et al. | |
| 2012/0199740 A1 | 8/2012 | Zeidler et al. | |
| 2014/0361167 A1 | 12/2014 | Morishita et al. | |

FOREIGN PATENT DOCUMENTS

| | | |
|---|---|---|
| JP | 201358314 A | 3/2013 |
| WO | 2005122208 A2 | 12/2005 |

OTHER PUBLICATIONS

Extended European Search Report issued in EP Application No. 18158061.4 dated Jul. 17, 2018.

* cited by examiner

*Primary Examiner* — Eliza W Osenbaugh-Stewart
(74) *Attorney, Agent, or Firm* — The Webb Law Firm

(57) ABSTRACT

A scanning electron microscope includes: a liner tube which transmits an electron beam; a scintillator having a through-hole into which the liner tube is inserted; a light guide which guides light generated by the scintillator; a conductive layer provided on a sensitive surface of the scintillator; and a conductive member provided in the scintillator, wherein the shortest distance between the liner tube and the conductive member is shorter than the shortest distance between the liner tube and the conductive layer, a voltage for accelerating electrons is applied to the conductive layer, and the conductive layer and the conductive member have a same potential.

12 Claims, 8 Drawing Sheets

SCANNING ELECTRON MICROSCOPE

Japanese Patent Application No. 2017-032554, filed on Feb. 23, 2017, is hereby incorporated by reference in its entirety.

BACKGROUND OF THE INVENTION

The present invention relates to a scanning electron microscope.

A known electron detector used in a scanning electron microscope includes a scintillator, a photomultiplier tube, and a light guide that connects the scintillator and the photomultiplier tube to each other. The electron detector detects an electron (a secondary electron or a backscattered electron) generated by irradiating a sample with an electron beam.

For example, U.S. Pat. No. 6,545,277 discloses an electron detector configured such that a through-hole is provided in a scintillator to enable a primary beam (an electron beam for irradiating a sample) to pass through the through-hole. A liner tube is inserted into the through-hole provided in the scintillator, and the primary beam passes through the liner tube.

With an electron detector, sufficient light emission for detection occurs in the scintillator as long as an electron has high energy when incident on the scintillator. However, since sufficient light emission does not occur when the energy of an electron is low when incident on the scintillator, detection becomes difficult. For example, Japanese Patent Application Publication No. 2013-58314 describes that, when energy of an electron upon incidence to a scintillator is lower than 5 keV, sufficient light emission does not occur and detection becomes difficult.

In order to address such a problem, in Japanese Patent Application Publication No. 2013-58314, a surface of the scintillator is uniformly coated by a conductive layer (a conductive body) and a positive voltage of 5 keV or higher is applied to the conductive layer. Accordingly, even when the energy of an electron is lower than 5 keV, since the electron is accelerated before reaching a sensitive surface of the scintillator and sufficient light emission occurs, detection can be performed.

FIG. 12 is a graph illustrating a potential distribution on a surface of a scintillator in a state where a conductive layer is not formed on the surface of the scintillator. Moreover, in FIG. 12, an abscissa represents a distance in a radial direction from an optical axis and an ordinate represents a voltage on the surface of the scintillator. In FIG. 12, a voltage is applied to a circumferential portion of the scintillator.

As is apparent from the result illustrated in FIG. 12, with a detector in which a liner tube is inserted into a through-hole provided in a scintillator as described in U.S. Pat. No. 6,545,277 mentioned above, when a conductive layer is not formed on a surface of the scintillator, since voltage is low in a vicinity (around r<4) of the liner tube, detection efficiency of electrons declines significantly.

However, with a detector in which a liner tube is inserted into a through-hole provided in a scintillator, when a conductive layer is formed on a surface of the scintillator, since a potential difference is created between the conductive layer and the liner tube, a discharge between the conductive layer and the liner tube becomes an issue.

Since the conductive layer formed on the surface of the scintillator must allow electrons to pass through (must transmit electrons), the conductive layer is formed extremely thinly. As a result, a resistance of the conductive layer is large. Therefore, when a discharge occurs between the scintillator and the liner tube, there is a risk that a delamination of the conductive layer on the surface of the scintillator may occur due to resistive heating during the discharge.

Although the possibility of an occurrence of a discharge can be sufficiently reduced by increasing the distance between the scintillator and the liner tube, this means that an area of a sensitive surface of the scintillator is to be reduced.

SUMMARY

The invention can provide a scanning electron microscope capable of preventing delamination due to a discharge of a conductive layer formed on a scintillator.

According to an aspect of the invention, there is provided a scanning electron microscope including:

a liner tube which transmits an electron beam;

a scintillator having a through-hole into which the liner tube is inserted;

a light guide which guides light generated by the scintillator;

a conductive layer provided on a sensitive surface of the scintillator; and a conductive member provided in the scintillator, wherein the shortest distance between the liner tube and the conductive member is shorter than the shortest distance between the liner tube and the conductive layer, a voltage for accelerating electrons is applied to the conductive layer, and the conductive layer and the conductive member have a same potential.

Figure 1:
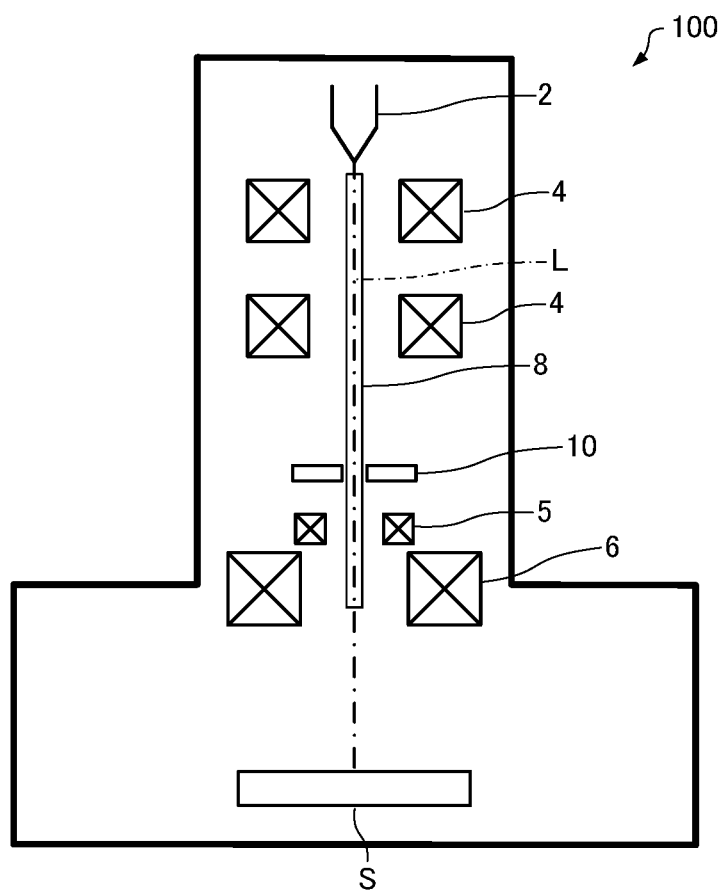
FIG. 1 is a diagram schematically illustrating a scanning electron microscope according to a first embodiment.

DETAILED DESCRIPTION OF THE EMBODIMENT (1) According to one embodiment of the invention, there is provided a scanning electron microscope including:

a liner tube which transmits an electron beam;

a scintillator having a through-hole into which the liner tube is inserted;

a light guide which guides light generated by the scintillator;

a conductive layer provided on a sensitive surface of the scintillator; and a conductive member provided in the scintillator, wherein the shortest distance between the liner tube and the conductive member is shorter than the shortest distance between the liner tube and the conductive layer, a voltage for accelerating electrons is applied to the conductive layer, and the conductive layer and the conductive member have a same potential.

In such a scanning electron microscope, since the shortest distance between the liner tube and the conductive member is shorter than the shortest distance between the liner tube and the conductive layer, a discharge is more likely to occur between the liner tube and the conductive member than between the liner tube and the conductive layer. Therefore, in such a scanning electron microscope, delamination of the conductive layer due to a discharge can be prevented.

(2) In the scanning electron microscope described above, the conductive member may be provided on an inner surface of the through-hole.

In such a scanning electron microscope, the shortest distance between the liner tube and the conductive member can be made shorter than the shortest distance between the liner tube and the conductive layer.

(3) In the scanning electron microscope described above, a thickness of the conductive member may be greater than a thickness of the conductive layer.

In such a scanning electron microscope, a resistance of a path along which a current created by a discharge flows through the conductive member can be made smaller than a resistance of a path along which a current created by a discharge flows through the conductive layer. Therefore, in such a scanning electron microscope, delamination of the conductive layer due to a discharge can be prevented.

(4) In the scanning electron microscope described above, the conductive member and the conductive layer may be separated from each other.

In such a scanning electron microscope, a current created by a discharge can be restricted from flowing through the conductive layer as compared to a case where, for example, the conductive member and the conductive layer are in contact with each other, and delamination of the conductive layer due to a discharge can be prevented.

(5) In the scanning electron microscope described above, the conductive member and the conductive layer may be in contact with each other.

In such a scanning electron microscope, since a mask for separating the conductive member and the conductive layer from each other need not be formed when forming the conductive layer, the conductive layer can be readily formed.

(6) In the scanning electron microscope described above, a resistance between a part of the conductive member with the shortest distance from the liner tube and an external terminal of the conductive member may be smaller than a resistance between a part of the conductive layer with the shortest distance from the liner tube and an external terminal of the conductive layer.

In such a scanning electron microscope, since a current created by a discharge is more likely to flow through the conductive member than through the conductive layer, delamination of the conductive layer due to a discharge can be reduced.

(7) In the scanning electron microscope described above, the scintillator may emit light from a light emitting surface on an opposite side to the sensitive surface, and the conductive member may be provided on the light emitting surface.

(8) In the scanning electron microscope described above, the conductive member provided on the light emitting surface may be positioned behind the liner tube when viewed from a light incident surface of the light guide.

In such a scanning electron microscope, the conductive member does not obstruct light emitted from the light emitting surface of the scintillator and incident on the light guide.

(9) The scanning electron microscope described above may further include a mirror which reflects, toward the light guide, light emitted from the light emitting surface.

In such a scanning electron microscope, light emitted from the light emitting surface of the scintillator can be efficiently guided to the light guide.

(10) In the scanning electron microscope described above, the scintillator and the light guide may be integrally provided.

In such a scanning electron microscope, since an optical element for guiding light emitted from the scintillator to the light guide need not be used, a simplified apparatus can be realized.

(11) In the scanning electron microscope described above, the conductive member may cover an entirety of a surface of the scintillator which is on an opposite side to the sensitive surface.

In such a scanning electron microscope, a resistance of a path along which a current created by a discharge flows through the conductive member can be made even smaller.

(12) In the scanning electron microscope described above, the conductive member may have a cylindrical surface which encloses the liner tube.

In such a scanning electron microscope, the possibility of an occurrence of a discharge can be reduced.

Preferable embodiments of the invention will be described in detail below with reference to the drawings. Note that the embodiments described below do not unduly limit the scope of the invention as stated in the claims. Note also that all of the elements described below should not necessarily be taken as essential elements of the invention.

1. First Embodiment 1.1. Scanning Electron Microscope

First, a scanning electron microscope according to a first embodiment of the invention will be described with reference to the drawings. FIG. 1 is a diagram schematically illustrating a scanning electron microscope 100 according to the first embodiment.

In the scanning electron microscope 100, an electron (a secondary electron or a backscattered electron) discharged from an irradiation point of an electron probe when scanning a surface of a sample S with the electron probe can be detected and converted into an image. As a result, in the scanning electron microscope 100, a scanning electron microscope image (a secondary electron image or a backscattered electron image) can be acquired.

As illustrated in FIG. 1, the scanning electron microscope 100 includes an electron source 2, a condenser lens 4, a deflector 5, an objective lens 6, a liner tube 8, and an electron detector 10.

The electron source 2 discharges an electron beam. The electron source 2 is, for example, a known electron gun. The electron beam advances along an optical axis L.

The condenser lens 4 causes the electron beam discharged from the electron source 2 to converge. In the illustrated example, the condenser lens 4 is arranged in two stages along the optical axis L.

The deflector 5 deflects the electron beam (an electron probe) converged by the condenser lens 4 and the objective lens 6. The deflector 5 is used in order to scan a surface of the sample S with the electron probe.

The objective lens 6 is an electron probe-forming lens in a final stage arranged immediately before the sample S.

The liner tube 8 is a tube provided in a passage of the electron beam discharged from the electron source 2. The liner tube 8 functions as a vacuum bulkhead for placing components with large outgassing such as the condenser lens 4, the deflector 5, and the objective lens 6 on the outside of a vacuum. The electron beam discharged from the electron source 2 travels through the liner tube 8 and irradiates the sample S.

The liner tube 8 provides electrical shielding between the inside of the liner tube 8 and a scintillator 12 so that the electron beam advancing along the optical axis L is not affected by a high voltage applied to the scintillator 12. For example, the liner tube 8 has a reference potential (a ground potential). Moreover, in the case of a configuration in which a high voltage is applied to a trajectory (a beam path) traced by the electron beam and the electron beam is decelerated immediately before reaching the sample S, the liner tube 8 has a same potential as an electrode (not shown) for forming the beam path.

The electron detector 10 detects an electron generated from the sample S. The electron detector 10 is a secondary electron detector which detects a secondary electron generated at the sample S. Alternatively, the electron detector 10 may be a backscattered electron detector which detects a backscattered electron generated at the sample S. In the scanning electron microscope 100, a scanning electron microscope image is generated based on a detection result of the electron detector 10.

In the scanning electron microscope 100, the sample S is placed on a sample stage (not shown). Alternatively, the scanning electron microscope 100 may include a lens, an aperture, and the like in addition to the optical system described above.

Figure 2:
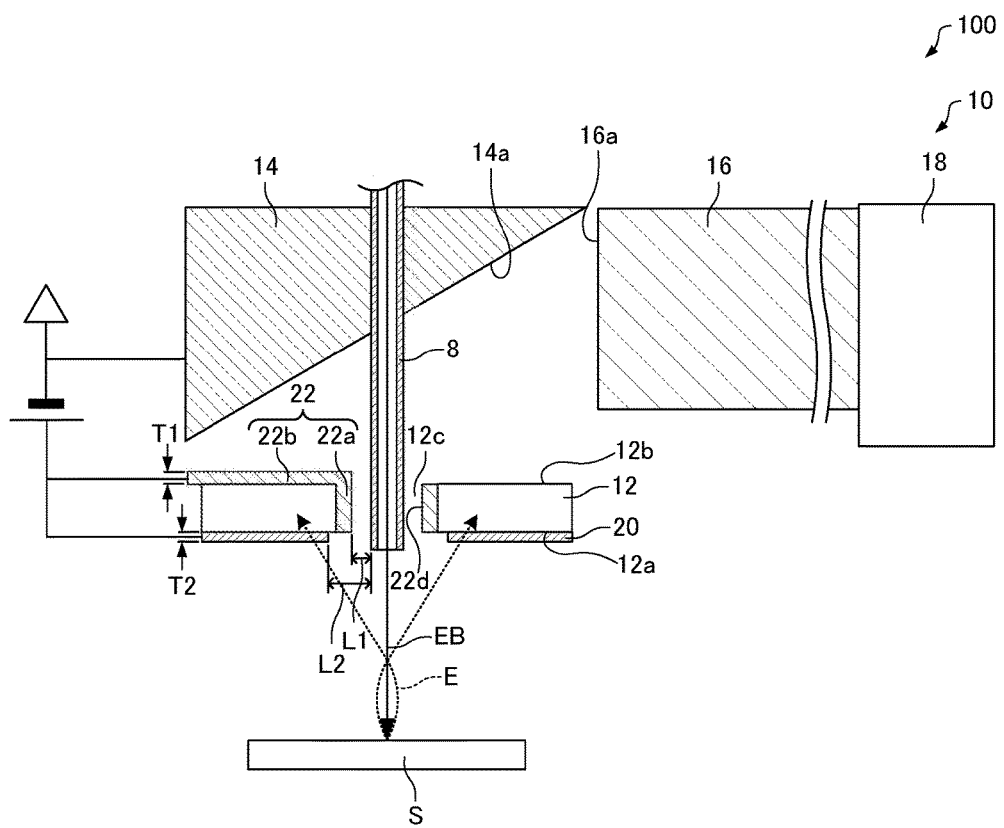
FIG. 2 is a sectional view schematically illustrating an electron detector of the scanning electron microscope according to the first embodiment.

FIG. 2 is a sectional view schematically illustrating the electron detector 10 of the scanning electron microscope 100.

As illustrated in FIG. 2, the electron detector 10 includes the scintillator 12, a mirror 14, a light guide 16, a photomultiplier tube (PMT) 18, a conductive layer 20, and a conductive member 22.

The scintillator 12 detects an electron E generated at the sample S when the sample S is irradiated by an electron beam EB, and converts the electron E into light. As the scintillator 12, for example, an yttrium aluminum garnet (YAG) crystal or plastic (an article obtained by dissolving an organic luminous substance in plastic) can be used. The scintillator 12 has a first surface 12a and a second surface 12b on an opposite side to the first surface 12a. In the example in FIG. 2, the first surface 12a is a bottom surface of the scintillator 12 and the second surface 12b is a top surface of the scintillator 12.

Figure 3:
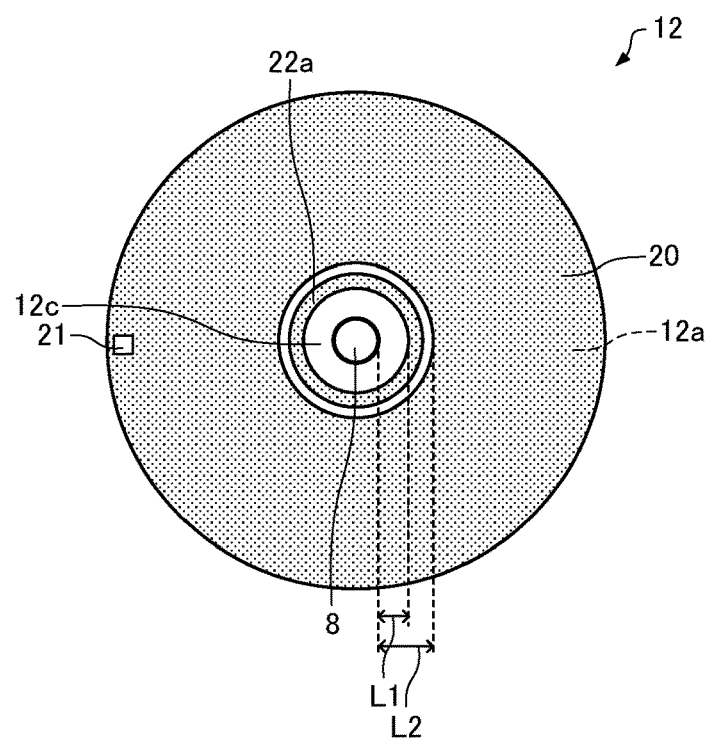
FIG. 3 is a plan view schematically illustrating a first surface of a scintillator.
Figure 4:
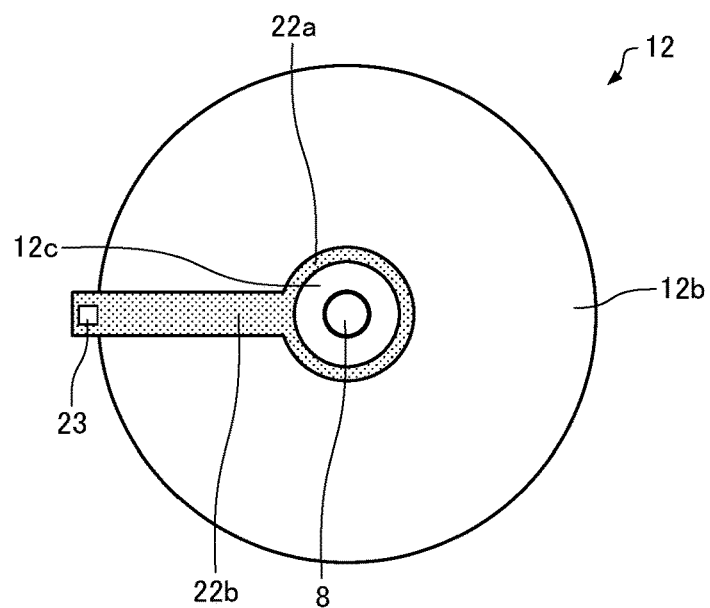
FIG. 4 is a plan view schematically illustrating a second surface of the scintillator.

FIG. 3 is a plan view schematically illustrating the first surface 12a of the scintillator 12. FIG. 4 is a plan view schematically illustrating the second surface 12b of the scintillator 12.

The first surface 12a of the scintillator 12 is a surface on which the electron E generated at the sample S is incident or, in other words, a sensitive surface. The second surface 12b of the scintillator 12 is a surface from which light generated by the scintillator 12 is emitted or, in other words, a light emitting surface.

The scintillator 12 is provided with a through-hole 12c. The liner tube 8 is inserted into the through-hole 12c. The through-hole 12c connects the first surface 12a and the second surface 12b with each other. The through-hole 12c has a cylindrical shape. The liner tube 8 is arranged so that a central axis of the liner tube 8 coincides with a central axis of the through-hole 12c. The central axis of the liner tube 8 coincides with the optical axis L.

The conductive layer 20 is provided on the first surface 12a of the scintillator 12. The electron E generated at the sample S passes through (is transmitted through) the conductive layer 20 and is incident on the first surface 12a of the scintillator 12.

The mirror 14 reflects light generated at the scintillator 12 and emitted from the second surface 12b, and causes the light to be incident on the light guide 16. A reflecting surface 14a of the mirror 14 is set at an angle such that light emitted from the second surface 12b of the scintillator 12 is reflected by the reflecting surface 14a and is incident on a light incident surface 16a of the light guide 16. The mirror 14 is provided with a through-hole for passing the liner tube 8 therethrough. A reference potential (a ground potential) is applied to the mirror 14.

The light guide 16 guides the incident light to the photomultiplier tube 18. The photomultiplier tube 18 has a light incident surface on which light from the light guide 16 is incident. The photomultiplier tube 18 converts light energy into electrical energy.

The conductive layer 20 is provided on the first surface 12a of the scintillator 12. A voltage for accelerating the electron E incident on the scintillator 12 is applied to the conductive layer 20. In other words, a positive voltage with respect to the reference potential of the apparatus is applied to the conductive layer 20. For example, a voltage of around several kV to 10 kV is applied to the conductive layer 20. The conductive layer 20 is provided with an external terminal 21 for applying a voltage to the conductive layer 20 from an external power source.

By applying a voltage to the scintillator 12 with the conductive layer 20, since even an electron with low energy is accelerated before the electron is incident on the first surface 12a of the scintillator 12, sufficient light emission can be produced at the scintillator 12. By applying a voltage to the scintillator 12 with the conductive layer 20, a potential difference is created between the scintillator 12 and the liner tube 8.

The conductive layer 20 has a thickness (film thickness) which enables the electron E to pass (to be transmitted) therethrough. The thickness of the conductive layer 20 is, for example, around several 10 nm. While a material of the conductive layer 20 is not particularly limited as long as the material is conductive, an example of the material is a metal such as aluminum. The conductive layer 20 is formed by depositing a metal film on the scintillator 12 by vapor deposition or the like.

The conductive member 22 is provided in the scintillator 12. The conductive member 22 is provided in order to prevent delamination of the conductive layer 20 by a discharge. The conductive member 22 includes a first portion 22a and a second portion 22b.

The first portion 22a of the conductive member 22 is provided on an inner surface of the through-hole 12c of the scintillator 12. The first portion 22a of the conductive member 22 includes a cylindrical surface 22d which encloses the liner tube 8. The cylindrical surface 22d is one continuous surface enclosing the liner tube 8. The cylindrical surface 22d desirably has little unevenness and is, for example, a glossy surface. A central axis of the cylindrical surface 22d coincides with the central axis of the liner tube 8.

The second portion 22b of the conductive member 22 is provided on the second surface 12b of the scintillator 12. The second portion 22b is provided with an external terminal 23 for applying a voltage to the conductive member 22 from an external power source. The second portion 22b functions as wiring for connecting the first portion 22a and the external terminal 23 to each other.

The second portion 22b is positioned behind the liner tube 8 when viewed from the light incident surface 16a of the light guide 16. In other words, the second portion 22b is shadowed by the liner tube 8 when viewed from the light incident surface 16a of the light guide 16. In the second surface 12b of the scintillator 12, the second portion 22b is formed in a region which emits light that is blocked by the liner tube 8 and does not reach the light incident surface 16a of the light guide 16.

Moreover, while the entire second portion 22b is desirably positioned behind the liner tube 8 when viewed from the light incident surface 16a of the light guide 16, a part of the second portion 22b may be positioned behind the liner tube 8.

As illustrated in FIGS. 2 and 3, the conductive member 22 and the conductive layer 20 are separated from each other. In other words, the conductive member 22 and the conductive layer 20 are not in contact with each other.

The shortest distance L1 between the liner tube 8 and the conductive member 22 (the first portion 22a) is shorter than the shortest distance L2 between the liner tube 8 and the conductive layer 20. Therefore, a probability of a discharge occurring between the liner tube 8 and the conductive member 22 can be made higher than a probability of a discharge occurring between the liner tube 8 and the conductive layer 20. In other words, a discharge is more likely to occur between the liner tube 8 and the conductive member 22 than between the liner tube 8 and the conductive layer 20.

A thickness T1 of the conductive member 22 is greater than a thickness T2 of the conductive layer 20. By setting the thickness T1 of the conductive member 22 greater than the thickness T2 of the conductive layer 20, a resistance of the conductive member 22 can be reduced. In the example in FIG. 2, a thickness of the first portion 22a and a thickness of the second portion 22b of the conductive member 22 are the same. Alternatively, the thickness of the first portion 22a and the thickness of the second portion 22b of the conductive member 22 may differ from each other.

The thickness T1 of the conductive member 22 is a size of a surface of the scintillator 12 on which the conductive member 22 is formed in a perpendicular direction of the surface. For example, the thickness T1 of the conductive member 22 (the second portion 22b) formed on the second surface 12b of the scintillator 12 is a size of the conductive member 22 in a perpendicular direction of the second surface 12b.

A material of the conductive member 22 is, for example, a metal. For example, the conductive member 22 is formed by cutting out a metal bulk in a predetermined shape. Moreover, in order to make the resistance of the conductive member 22 smaller than a resistance of the conductive layer 20, a material with higher electric conductivity than the material of the conductive layer 20 may be used as the material of the conductive member 22.

The conductive member 22 and the conductive layer 20 have a same potential. In other words, a same voltage as the conductive layer 20 is applied to the conductive member 22.

Figure 5:
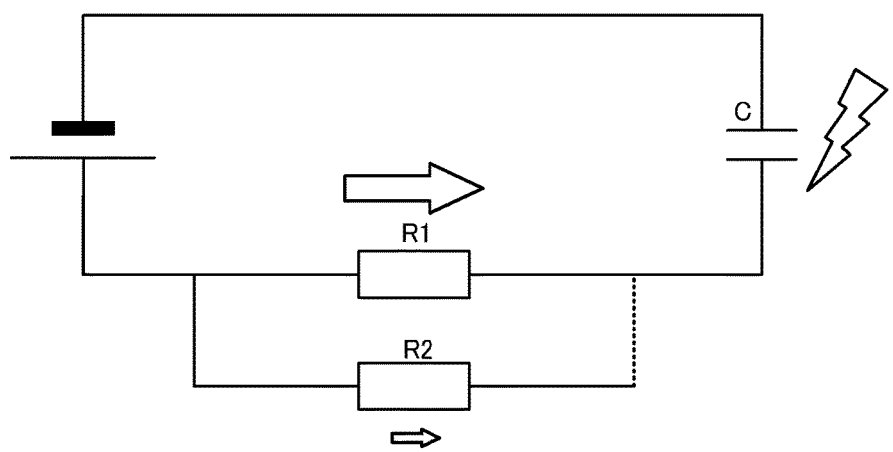
FIG. 5 is a diagram for illustrating a path along which a current created by a discharge flows in the electron detector.

FIG. 5 is a diagram for explaining a path along which a current created by a discharge flows in the electron detector 10. In FIG. 5, a capacitor C represents a space between the conductive member 22 and the liner tube 8. In addition, in FIG. 5, a resistance of a path along which a current created by a discharge passes through the conductive member 22 is denoted by R1 and a resistance of a path along which a current created by a discharge passes through the conductive layer 20 is denoted by R2.

In the present embodiment, the resistance R1 is significantly smaller than the resistance R2 (R1<<R2). Therefore, a current created by a discharge mostly passes through the conductive member 22 and hardly passes through the conductive layer 20. As a result, delamination of the conductive layer 20 due to a discharge can be more reliably prevented.

In this case, the resistance R1 of the path along which a current created by a discharge passes through the conductive member 22 corresponds to a resistance between a part of the conductive member 22 with the shortest distance from the liner tube 8 and the external terminal 23 of the conductive member 22. In addition, the resistance R2 of the path along which a current created by a discharge passes through the conductive layer 20 corresponds to a resistance between a part of the conductive layer 20 with the shortest distance from the liner tube 8 and the external terminal 21 of the conductive layer 20.

For example, the scanning electron microscope 100 according to the present embodiment has the following features.

In the scanning electron microscope 100, the shortest distance L1 between the liner tube 8 and the conductive member 22 is shorter than the shortest distance L2 between the liner tube 8 and the conductive layer 20, and the conductive layer 20 and the conductive member 22 have a same potential. Therefore, in the scanning electron microscope 100, a discharge is more likely to occur between the liner tube 8 and the conductive member 22 than between the liner tube 8 and the conductive layer 20. As a result, in the scanning electron microscope 100, delamination of the conductive layer 20 due to a discharge can be prevented.

In the scanning electron microscope 100, a resistance (the resistance R1) between a part of the conductive member 22 with the shortest distance from the liner tube 8 and the external terminal 23 of the conductive member 22 is smaller than a resistance (the resistance R2) between a part of the conductive layer 20 with the shortest distance from the liner tube 8 and the external terminal 21 of the conductive layer 20. Therefore, in the scanning electron microscope 100, a current created by a discharge more readily flows through the conductive member 22 than the conductive layer 20. As a result, in the scanning electron microscope 100, delamination of the conductive layer 20 due to a discharge can be prevented.

In the scanning electron microscope 100, the thickness T1 of the conductive member 22 is greater than the thickness T2 of the conductive layer 20. Therefore, in the scanning electron microscope 100, the resistance R1 of a path along which a current created by a discharge flows through the conductive member 22 can be made smaller than the resistance R2 of a path along which a current created by a discharge flows through the conductive layer 20. As a result, in the scanning electron microscope 100, since a current created by a discharge passes through the conductive member 22, delamination of the conductive layer 20 due to a discharge can be prevented.

In the scanning electron microscope 100, the conductive member 22 is provided on an inner surface of the through-hole 12c provided in the scintillator 12. Therefore, in the scanning electron microscope 100, the shortest distance L1 between the liner tube 8 and the conductive member 22 can be made shorter than the shortest distance L2 between the liner tube 8 and the conductive layer 20.

In the scanning electron microscope 100, the conductive member 22 and the conductive layer 20 are separated from each other. Therefore, in the scanning electron microscope 100, a current created by a discharge can be restricted from flowing through the conductive layer 20 as compared to a case where, for example, the conductive member 22 and the conductive layer 20 are in contact with each other, and delamination of the conductive layer 20 due to a discharge can be prevented.

In the scanning electron microscope 100, the second portion 22b of the conductive member 22 is positioned behind the liner tube 8 when viewed from the light incident surface 16a of the light guide 16. Therefore, in the scanning electron microscope 100, the second portion 22b of the conductive member 22 does not obstruct light emitted from the second surface 12b and incident on the light guide 16. To begin with, light emitted from a region positioned behind the liner tube 8 of the second surface 12b of the scintillator 12 when viewed from the light incident surface 16a of the light guide 16 is obstructed by the liner tube 8 and cannot be incident on the light guide 16.

The scanning electron microscope 100 includes the mirror 14 which reflects light emitted from the second surface 12b of the scintillator 12 toward the light guide 16. Therefore, in the scanning electron microscope 100, light emitted from the second surface 12b of the scintillator 12 can be efficiently guided to the light guide 16. For example, when the light guide 16 is directly connected to the scintillator 12 (for example, refer to FIG. 9), since it is difficult to guide light on an opposite side to a side of the scintillator 12 to which the light guide 16 is connected to the light guide 16, light cannot be efficiently guided to the light guide 16.

In the scanning electron microscope 100, the conductive member 22 includes the cylindrical surface 22d which encloses the liner tube 8. In other words, a surface (the cylindrical surface 22d) of the conductive member 22 facing the liner tube 8 is one continuous surface. Therefore, in the scanning electron microscope 100, the possibility of occurrence of a discharge can be reduced as compared to a case where the surface of the conductive member 22 facing the liner tube 8 is a discontinuous surface. In this case, a discontinuous surface refers to a case where the surface is not one continuous surface and a slit or a groove is formed thereon or the surface is constituted by a plurality of surfaces.

As described above, in the scanning electron microscope 100, since delamination of the conductive layer 20 due to a discharge can be prevented, conditioning can be performed. Conditioning refers to causing a discharge by applying a voltage higher than normally used voltage (for example, a voltage higher by around 20 to 50 percent) to clean a surface of an electrode. Performing conditioning enables withstand voltage to be improved.

1.2. Modification

Figure 6:
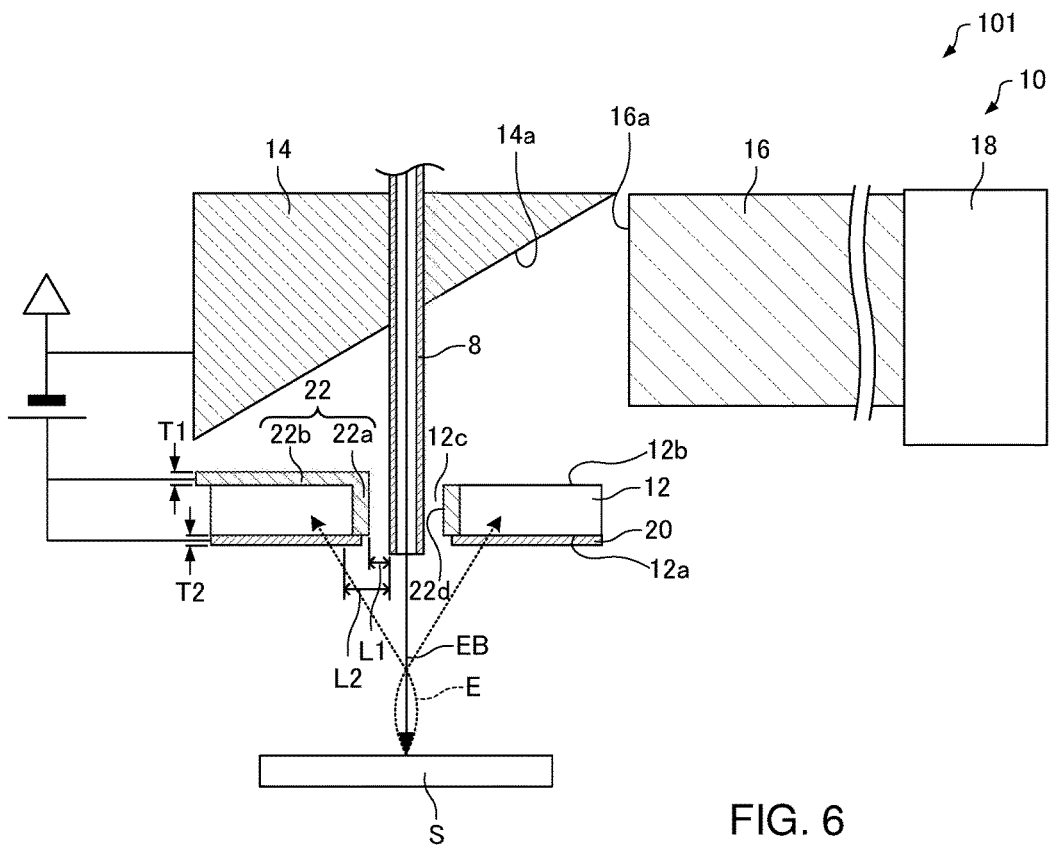
FIG. 6 is a sectional view schematically illustrating an electron detector of a scanning electron microscope according to a modification of the first embodiment.
Figure 7:
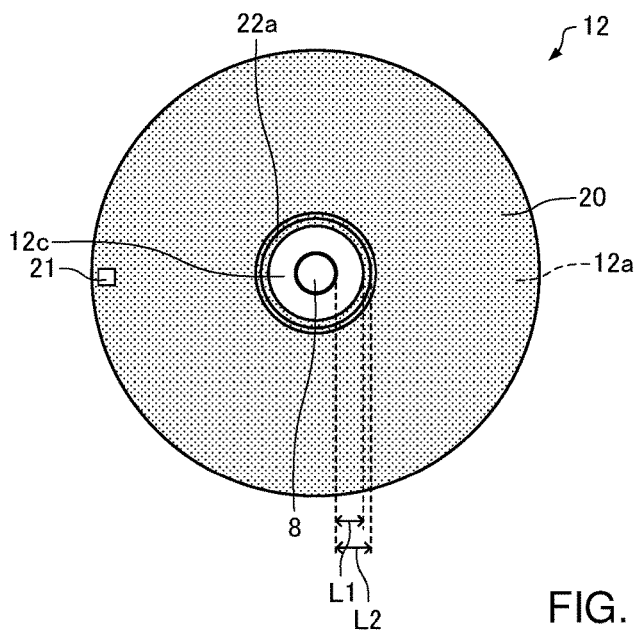
FIG. 7 is a plan view schematically illustrating a first surface of a scintillator of the scanning electron microscope according to the modification of the first embodiment.
Figure 8:
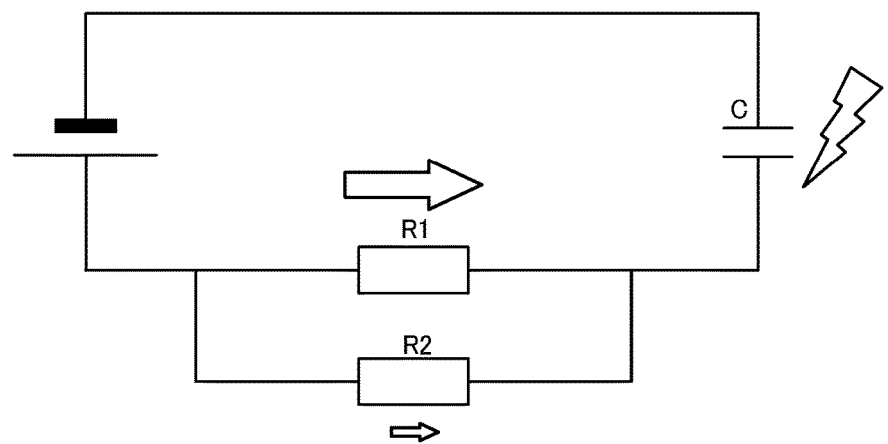
FIG. 8 is a diagram for illustrating a path along which a current created by a discharge flows in the electron detector of the scanning electron microscope according to the modification of the first embodiment.

Next, a scanning electron microscope according to a modification of the first embodiment will be described with reference to the drawings. FIG. 6 is a sectional view schematically illustrating the electron detector 10 of a scanning electron microscope 101 according to the modification of the first embodiment. FIG. 7 is a plan view schematically illustrating the first surface 12a of the scintillator 12 of the scanning electron microscope 101 according to the modification of the first embodiment. FIG. 8 is a diagram for explaining a path along which a current created by a discharge flows in the electron detector 10 of the scanning electron microscope 101 according to the modification of the first embodiment.

Hereinafter, in the scanning electron microscope 101 according to the modification of the first embodiment, members having similar functions to the components of the scanning electron microscope 100 according to the first embodiment will be denoted by same reference characters and a detailed description thereof will be omitted.

In the scanning electron microscope 100 described earlier, as illustrated in FIGS. 2 and 3, the conductive member 22 and the conductive layer 20 are separated from each other. On the other hand, in the scanning electron microscope 101, as illustrated in FIGS. 6 and 7, the conductive member 22 and the conductive layer 20 are in contact with each other.

When the conductive member 22 and the conductive layer 20 are in contact with each other, a difference between the resistance R1 of a path along which a current created by a discharge passes through the conductive member 22 and the resistance R2 of a path along which a current created by a discharge passes through the conductive layer 20 is increased as compared to a case where the conductive member 22 and the conductive layer 20 are separated from each other. In other words, in the present modification, the resistance R1 is made significantly smaller than the resistance R2. For example, a ratio R1/R2 between the resistance R1 and the resistance R2 is set to R1/R2<1/100. In this manner, by making the resistance R1 smaller than the resistance R2, even when the conductive member 22 and the conductive layer 20 are in contact with each other, since a current created by a discharge mostly passes through the conductive member 22, delamination of the conductive layer 20 due to a discharge can be prevented.

In the scanning electron microscope 101 according to the present modification, delamination of the conductive layer 20 due to a discharge can be prevented in a similar manner to the scanning electron microscope 100 according to the first embodiment described earlier.

In addition, in the present modification, since the conductive member 22 and the conductive layer 20 are in contact with each other, a mask for separating the conductive member 22 and the conductive layer 20 from each other need not be formed when forming the conductive layer 20 and the conductive layer 20 can be readily formed.

2. Second Embodiment

Figure 9:
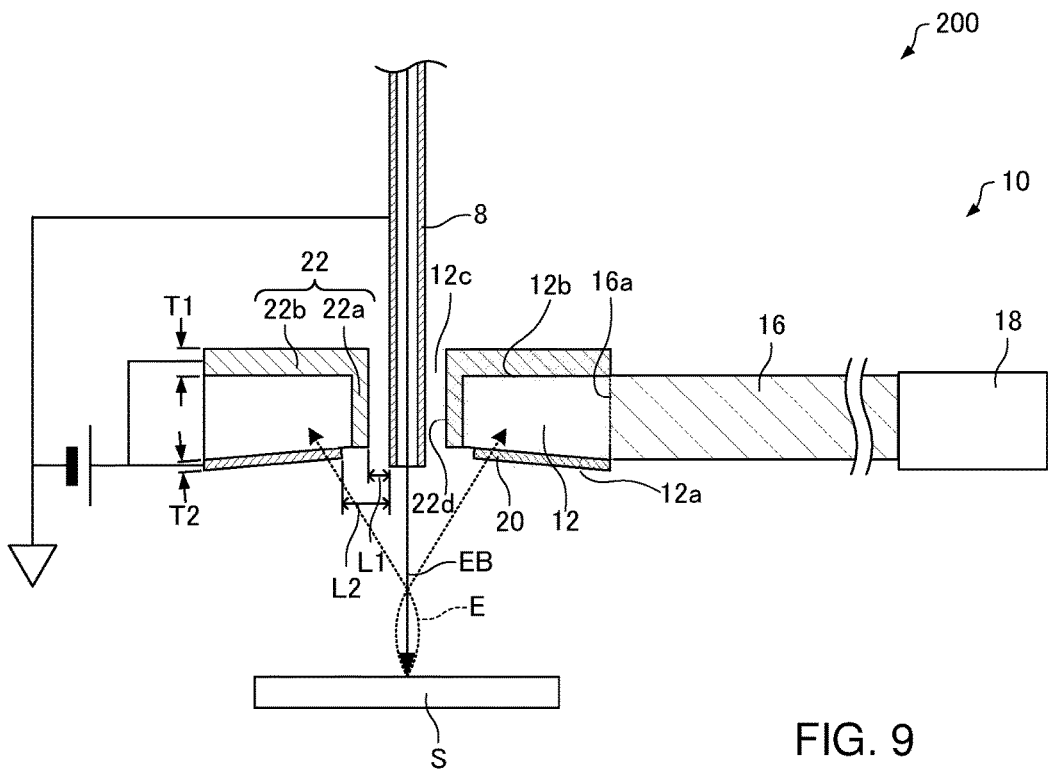
FIG. 9 is a sectional view schematically illustrating an electron detector of a scanning electron microscope according to a second embodiment.
Figure 10:
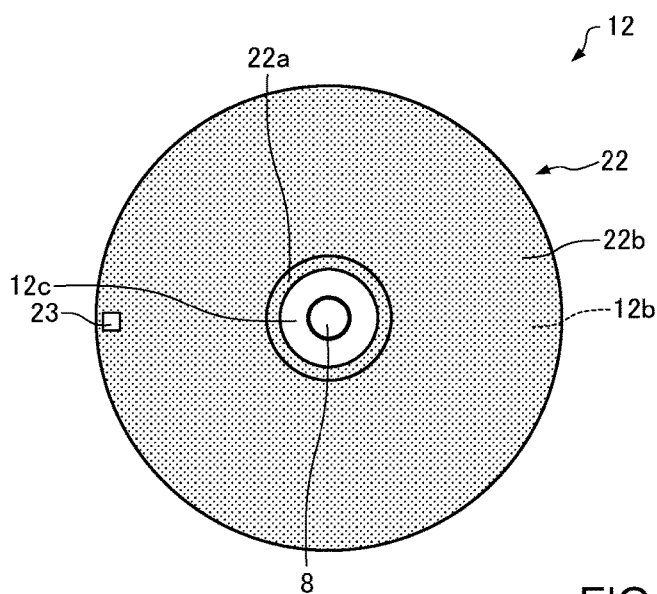
FIG. 10 is a plan view schematically illustrating a second surface of the electron detector of the scanning electron microscope according to the second embodiment.

Next, a scanning electron microscope according to a second embodiment of the invention will be described with reference to the drawings. FIG. 9 is a sectional view schematically illustrating the electron detector 10 of a scanning electron microscope 200 according to the second embodiment. FIG. 10 is a plan view schematically illustrating the second surface 12b of the electron detector 10 of the scanning electron microscope 200 according to the second embodiment.

Hereinafter, in the scanning electron microscope 200 according to the second embodiment, members having similar functions to the components of the scanning electron microscope 100 according to the first embodiment will be denoted by same reference characters and a detailed description thereof will be omitted.

In the scanning electron microscope 100 described earlier, as illustrated in FIG. 2, the scintillator 12 and the light guide 16 are separated from each other. On the other hand, in the scanning electron microscope 200, as illustrated in FIG. 9, the scintillator 12 and the light guide 16 are integrally configured.

In addition, in the scanning electron microscope 100 described earlier, the second surface 12b of the scintillator 12 is a light emitting surface. On the other hand, in the scanning electron microscope 200, the second surface 12b of the scintillator 12 is not a light emitting surface.

The first surface 12a of the scintillator 12 is a sensitive surface of the scintillator 12. In the example in FIG. 9, the scintillator 12 is shaped such that a thickness of the scintillator 12 increases from the through-hole 12c toward an outer side of the scintillator 12. As a result, the first surface 12a of the scintillator 12 is inclined from the through-hole 12c toward the outer side of the scintillator 12. Therefore, an area of the first surface 12a to be the sensitive surface of the scintillator 12 can be increased as compared to a case where, for example, the first surface 12a is not inclined.

In the present embodiment, the second surface 12b of the scintillator 12 is neither a light emitting surface nor a sensitive surface. As illustrated in FIGS. 9 and 10, the second portion 22b of the conductive member 22 covers an entirety of the second surface 12b of the scintillator 12. Therefore, the resistance R1 (refer to FIG. 5) of a path along which a current created by a discharge flows through the conductive member 22 can be made even smaller.

The thickness of the second portion 22b of the conductive member 22 is greater than, for example, the thickness of the first portion 22a of the conductive member 22. Therefore, the resistance of the conductive member 22 (the second portion 22b) can be made smaller while maintaining the shortest distance L1 between the conductive member 22 (the first portion 22a) and the liner tube 8.

The light guide 16 is connected to a side surface (a surface connecting the first surface 12a and the second surface 12b with each other) of the scintillator 12. The light guide 16 and the scintillator 12 are desirably connected so that a refraction index change at a connecting part does not increase.

Moreover, while the conductive member 22 and the conductive layer 20 are not in contact with each other in the example in FIGS. 9 and 10, the conductive member 22 and the conductive layer 20 may be in contact with each other in a similar manner to the scanning electron microscope 101 according to the modification of the first embodiment described above.

In the scanning electron microscope 200 according to the second embodiment, delamination of the conductive layer 20 due to a discharge can be prevented in a similar manner to the scanning electron microscope 100 according to the first embodiment described earlier.

Furthermore, in the scanning electron microscope 200, the scintillator 12 and the light guide 16 are integrally constructed. Therefore, since an optical element for guiding light emitted from the scintillator 12 to the light guide 16 need not be used, a simplified apparatus can be realized.

In addition, in the scanning electron microscope 200, since the conductive member 22 covers the entire second surface 12b of the scintillator 12, the resistance R1 (refer to FIG. 5) of a path along which a current created by a discharge flows through the conductive member 22 can be made even smaller.

3. Third Embodiment

Figure 11:
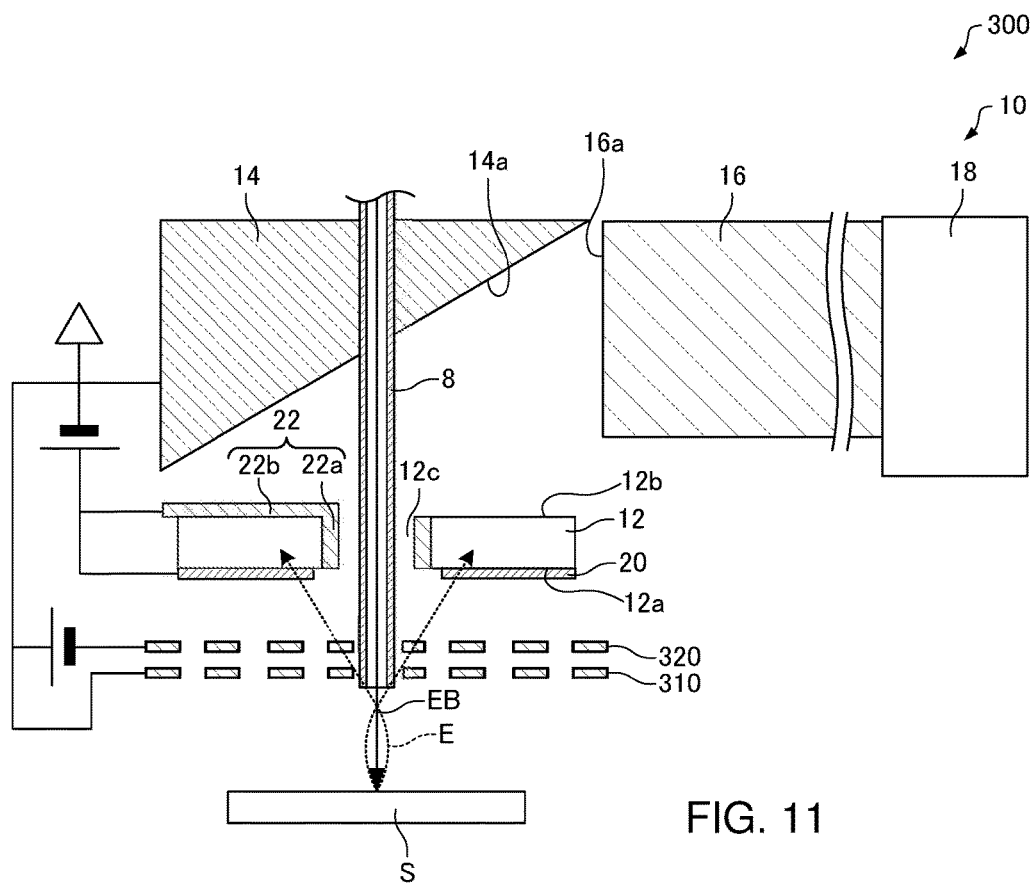
FIG. 11 is a sectional view schematically illustrating an electron detector of a scanning electron microscope according to a third embodiment.
Figure 12:
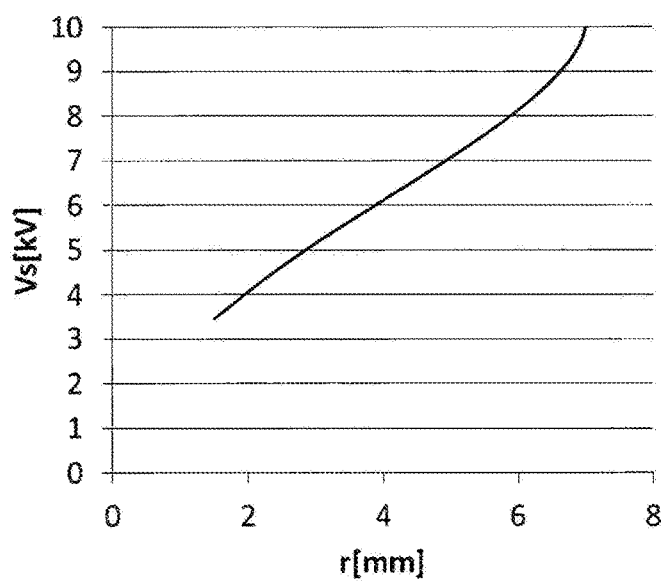
FIG. 12 is a graph illustrating a potential distribution on a surface of a scintillator in a state where a conductive layer is not formed on the surface of the scintillator.

Next, a scanning electron microscope according to a third embodiment of the invention will be described with reference to the drawings. FIG. 11 is a sectional view schematically illustrating the electron detector 10 of a scanning electron microscope 300 according to the third embodiment.

Hereinafter, in the scanning electron microscope 300 according to the third embodiment, members having similar functions to the components of the scanning electron microscope 100 according to the first embodiment will be denoted by same reference characters and a detailed description thereof will be omitted.

As illustrated in FIG. 11, the scanning electron microscope 300 is constituted by a first grid 310 and a second grid 320.

The first grid 310 and the second grid 320 are arranged in front of the first surface 12a that is a sensitive surface of the scintillator 12. In the example in FIG. 11, the first grid 310 is arranged closer to the sample S than the second grid 320.

A reference potential (a ground potential) is applied to the first grid 310. The first grid 310 has a same potential as the liner tube 8. The first grid 310 is used to reduce an effect of a high voltage applied to the scintillator 12 on the electron beam EB.

The second grid 320 is used for energy-selecting the electron E generated at the sample S. A predetermined voltage is applied to the second grid 320. In the scanning electron microscope 300, the electron E having been energy-selected by the second grid 320 can be detected by the electron detector 10.

Although the scanning electron microscope 300 in FIG. 11 is configured so as to include both the first grid 310 and the second grid 320, the scanning electron microscope 300 may be configured so as to include any of the first grid 310 and the second grid 320.

In the scanning electron microscope 300 according to the third embodiment, delamination of the conductive layer 20 due to a discharge can be prevented in a similar manner to the scanning electron microscope 100 according to the first embodiment described earlier.

In addition, the scanning electron microscope 300 includes the first grid 310 which is arranged in front of the sensitive surface (the first surface 12a) of the scintillator 12 and which has a same potential as the liner tube 8. Therefore, in the scanning electron microscope 300, an effect of a high voltage applied to the scintillator 12 on the electron beam EB can be more reliably reduced.

Furthermore, in the scanning electron microscope 300, the electron E generated at the sample S can be energy-selected by the second grid 320 and the energy-selected electron E can be detected by the electron detector 10.

Note that the above embodiments and modifications are merely examples, and the invention is not limited to the above embodiments and modifications. For example, the above embodiments and modifications may be appropriately combined.

The invention includes various other configurations substantially the same as the configurations described in connection with the above embodiments (e.g., a configuration having the same function, method, and results, or a configuration having the same objective and effects). The invention also includes a configuration in which an unsubstantial section (element) described in connection with the above embodiments is replaced by another section (element). The invention also includes a configuration having the same effects as those of the configurations described in connection with the above embodiments, or a configuration capable of achieving the same objective as that of the configurations described in connection with the above embodiments. The invention further includes a configuration in which a known technique is added to the configurations described in connection with the above embodiments.

Although only some embodiments of the invention have been described in detail above, those skilled in the art would readily appreciate that many modifications are possible in the embodiments without materially departing from the novel teachings and advantages of the invention. Accordingly, all such modifications are intended to be included within the scope of the invention.

What is claimed is:

1. A scanning electron microscope, comprising:
a liner tube which transmits an electron beam;
a scintillator having a through-hole into which the liner tube is inserted;
a light guide which guides light generated by the scintillator;
a conductive layer provided on a sensitive surface of the scintillator; and
a conductive member provided in the scintillator, wherein the shortest distance between the liner tube and the conductive member is shorter than the shortest distance between the liner tube and the conductive layer,
a voltage for accelerating electrons is applied to the conductive layer, and
the conductive layer and the conductive member have a same potential.

2. The scanning electron microscope according to claim 1, wherein the conductive member is provided on an inner surface of the through-hole.

3. The scanning electron microscope according to claim 1, wherein a thickness of the conductive member is greater than a thickness of the conductive layer.

4. The scanning electron microscope according to claim 1, wherein the conductive member and the conductive layer are separated from each other.

5. The scanning electron microscope according to claim 1, wherein the conductive member and the conductive layer are in contact with each other.

6. The scanning electron microscope according to claim 1, wherein a resistance between a part of the conductive member with the shortest distance from the liner tube and an external terminal of the conductive member is smaller than a resistance between a part of the conductive layer with the shortest distance from the liner tube and an external terminal of the conductive layer.

7. The scanning electron microscope according to claim 1, wherein the scintillator emits light from a light emitting surface on an opposite side to the sensitive surface; and
wherein the conductive member is provided on the light emitting surface.

8. The scanning electron microscope according to claim 7, wherein the conductive member provided on the light emitting surface is positioned behind the liner tube when viewed from a light incident surface of the light guide.

9. The scanning electron microscope according to claim 7, further comprising:
a mirror which reflects, toward the light guide, light emitted from the light emitting surface.

10. The scanning electron microscope according to claim 1, wherein the scintillator and the light guide are integrally provided.

11. The scanning electron microscope according to claim 10, wherein the conductive member covers an entirety of a surface of the scintillator which is on an opposite side to the sensitive surface.

12. The scanning electron microscope according to claim 1, wherein the conductive member has a cylindrical surface which encloses the liner tube.

* * * * *